United States Patent
Dickey et al.

(10) Patent No.: US 8,637,123 B2
(45) Date of Patent: Jan. 28, 2014

(54) OXYGEN RADICAL GENERATION FOR RADICAL-ENHANCED THIN FILM DEPOSITION

(75) Inventors: Eric R. Dickey, Portland, OR (US); William A. Barrow, Beaverton, OR (US)

(73) Assignee: Lotus Applied Technology, LLC, Hillsboro, OR (US)

( * ) Notice: Subject to any disclaimer, the term of this patent is extended or adjusted under 35 U.S.C. 154(b) by 68 days.

(21) Appl. No.: 12/980,234

(22) Filed: Dec. 28, 2010

(65) Prior Publication Data

US 2011/0159204 A1 Jun. 30, 2011

Related U.S. Application Data

(60) Provisional application No. 61/290,826, filed on Dec. 29, 2009.

(51) Int. Cl.
*C23C 16/00* (2006.01)

(52) U.S. Cl.
USPC .......................... 427/569; 427/575; 427/576

(58) Field of Classification Search
None
See application file for complete search history.

(56) References Cited

U.S. PATENT DOCUMENTS

| | | | |
|---|---|---|---|
| 4,058,430 A | 11/1977 | Suntola et al. |
| 5,338,362 A | 8/1994 | Imahashi |
| 5,462,602 A | 10/1995 | Misiano et al. |
| 5,514,217 A | 5/1996 | Niino et al. |
| 5,730,802 A | 3/1998 | Ishizumi et al. |
| 5,817,550 A | 10/1998 | Carey et al. |
| 6,037,002 A | 3/2000 | Hintermaier |
| 6,165,554 A | 12/2000 | Halpern et al. |
| 6,186,090 B1 | 2/2001 | Dotter, II et al. |
| 6,200,893 B1 | 3/2001 | Sneh |
| 6,287,988 B1 | 9/2001 | Nagamine et al. |
| 6,576,053 B1 | 6/2003 | Kim et al. |
| 6,616,986 B2 | 9/2003 | Sherman |
| 6,620,288 B2 | 9/2003 | Shinohara et al. |

(Continued)

FOREIGN PATENT DOCUMENTS

| | | |
|---|---|---|
| KR | 10-2004-0035083 A | 4/2004 |
| WO | WO 00/08899 | 2/2000 |

(Continued)

OTHER PUBLICATIONS

Korean Intellectual Property Office, International Search Report and Written Opinion, International Patent Application No. PCT/US2010/062301, dated Jul. 22, 2011, 7 pages.

(Continued)

*Primary Examiner* — Joseph Miller, Jr.
(74) *Attorney, Agent, or Firm* — Stoel Rives LLP

(57) ABSTRACT

A method of radical-enhanced atomic layer deposition (RE-ALD) involves alternating exposure of a substrate to a first precursor gas and to radicals, such as monatomic oxygen radicals (O.), generated from an oxygen-containing second precursor gas, while maintaining spatial or temporal separation of the radicals and the first precursor gas. Simplified reactor designs and process control are possible when the first and second precursor gases are nonreactive under normal processing conditions and can therefore be allowed to mix after the radicals recombine or otherwise abate. In some embodiments, the second precursor gas is an oxygen-containing compound, such as carbon dioxide ($CO_2$) or nitrous oxide ($N_2O$) for example, or a mixture of such oxygen-containing compounds, and does not contain significant amounts of normal oxygen ($O_2$).

25 Claims, 3 Drawing Sheets

(56) References Cited

U.S. PATENT DOCUMENTS

| | | | |
|---|---|---|---|
| 6,664,186 | B1 | 12/2003 | Callegari et al. |
| 6,752,869 | B2 | 6/2004 | Lee et al. |
| 6,794,220 | B2 | 9/2004 | Hirai et al. |
| 6,797,337 | B2 | 9/2004 | Dando et al. |
| 6,812,157 | B1 | 11/2004 | Gadgil |
| 6,820,570 | B2 | 11/2004 | Kilpela et al. |
| 6,827,789 | B2 | 12/2004 | Lee et al. |
| 6,888,172 | B2 | 5/2005 | Ghosh |
| 6,932,871 | B2 | 8/2005 | Chang et al. |
| 7,074,719 | B2 | 7/2006 | Kim et al. |
| 7,323,231 | B2 | 1/2008 | Derderian |
| 7,361,387 | B2 | 4/2008 | Nguyen |
| 7,435,445 | B2 | 10/2008 | Shin et al. |
| 7,476,420 | B2 | 1/2009 | Skarp et al. |
| 8,137,464 | B2 | 3/2012 | Dickey et al. |
| 8,154,066 | B2 | 4/2012 | Ahn et al. |
| 2003/0089308 | A1 | 5/2003 | Raaijmakers |
| 2003/0143319 | A1* | 7/2003 | Park et al. ............ 427/64 |
| 2003/0168001 | A1 | 9/2003 | Sneh |
| 2003/0232511 | A1 | 12/2003 | Metzner et al. |
| 2004/0194691 | A1 | 10/2004 | George et al. |
| 2004/0224504 | A1 | 11/2004 | Gadgil |
| 2004/0261703 | A1 | 12/2004 | Kobrin et al. |
| 2005/0081787 | A1* | 4/2005 | Im et al. ............ 118/715 |
| 2005/0172897 | A1 | 8/2005 | Jansen |
| 2005/0175789 | A1 | 8/2005 | Helms, Jr et al. |
| 2006/0068519 | A1 | 3/2006 | Dunbar et al. |
| 2006/0228897 | A1 | 10/2006 | Timans |
| 2007/0111545 | A1 | 5/2007 | Lee et al. |
| 2007/0224348 | A1 | 9/2007 | Dickey et al. |
| 2007/0281089 | A1 | 12/2007 | Heller et al. |
| 2008/0026162 | A1* | 1/2008 | Dickey et al. ............ 427/569 |
| 2008/0092814 | A1 | 4/2008 | Yan et al. |
| 2008/0107825 | A1 | 5/2008 | Ishizaka et al. |
| 2008/0138539 | A1 | 6/2008 | Breitung et al. |
| 2009/0093130 | A1* | 4/2009 | Owada et al. ............ 438/778 |
| 2009/0297696 | A1 | 12/2009 | Pore et al. |
| 2010/0143710 | A1 | 6/2010 | Dickey et al. |
| 2010/0189900 | A1 | 7/2010 | Dickey et al. |
| 2011/0070380 | A1 | 3/2011 | Shero et al. |

FOREIGN PATENT DOCUMENTS

| | | | |
|---|---|---|---|
| WO | WO 2004/105149 | A1 | 12/2004 |
| WO | WO 2006/088463 | A1 | 8/2006 |
| WO | WO 2007/126582 | A2 | 11/2007 |
| WO | WO 2007/126585 | A2 | 11/2007 |

OTHER PUBLICATIONS

A.W. Smith, N. Copeland, D. Gererd and D. Nicholas, "PECVD of $SiO_x$ Barrier Films," *45th Annual Technical Conference Proceedings of the Society of Vacuum Coaters*, pp. 525-529, 2002.

E. Langereis, S.B.S. Heil, M. Creatore, M.C.M. Van De Sanden and W.M.M. Kessels, "Plasma-Assisted Atomic Layer Deposition of $Al_2O_3$ on Polymers," *49th Annual Technical Conference Proceedings of the Society of Vacuum Coaters*, pp. 151-154, 2006.

Erlat et al., Ultra-high Barrier Coatings on Polymer Substrates for Flexible Optoelectronics: Water Vapor Transport and Measurement Systems, 47th Ann. Tech. Conf. Proc., pp. 654-659, Society of Vacuum Coaters, Apr. 2004, 6 pages.

H. Suttle, A.J. Topping and H.E Assender, "Vacuum Deposition of High Performance Gas Barrier Materials," Proceedings of the Fall Conference of the Association of Industrial Metallizers, Coaters and Laminators (AIMCAL), 2008.

Keunjun Kim et al., Characteristics of Cobalt Thin Films Deposited by Remote Plasma ALD Method and Dicobalt Octacarbonyl, J. Electrochem. Soc., v. 154, No. 3, pp. H177-H181, Jan. 2007.

M. Creatore, V.I.T.A. Lohmann, M.A. Blauw and M.C.M. Van De Sanden, "Flexible Organic Electronics: the Role of Plasma Deposition in Mutli-Layer Permeation Barrier Technology," *49th Annual Technical Conference Proceedings of the Society of Vacuum Coaters*, pp. 143-146, 2006.

M. George, P. Morse, and J. Madocks, "High Barrier Transparent Coatings on Web by New Plasma Enhanced Chemical Vapor Deposition Process," *50th Annual Technical Conference Proceedings of the Society of Vacuum Coaters*, pp. 715-718, 2007.

Extended European Search Report, dated Jul. 2, 2013 on EP10844279.9; 2 pages.

* cited by examiner

OXYGEN RADICAL GENERATION FOR RADICAL-ENHANCED THIN FILM DEPOSITION

RELATED APPLICATION

This application claims the benefit under 35 U.S.C. §119 (e) from U.S. Provisional Patent Application No. 61/290,826, filed Dec. 29, 2009, which is incorporated herein by reference.

TECHNICAL FIELD

The field of the present disclosure relates to thin film deposition, including atomic layer deposition (ALD), and more particularly to radical-enhanced thin film deposition, such as radical-enhanced ALD.

BACKGROUND

U.S. patent application Ser. No. 11/829,050, filed Jul. 26, 2007 and published as Pub. No. US 2008/0026162 of Dickey et al. ("the '050 application") describes various methods and systems for radical-enhanced atomic layer deposition (REALD). The specification of the '050 application, which is incorporated herein by reference in its entirety, describes deposition methods involving alternating exposure of a substrate to a first precursor gas and a radical species, wherein the radical species is generated in-situ by an excitation source such as a steady-state direct-current (DC) or radio-frequency (RF) plasma generator. The first precursor gas is introduced at a location spaced apart from and generally downstream from where the radical species is generated, to provide a radical deactivation zone therebetween. In some embodiments disclosed in the '050 application, the plasma generator generates a direct plasma proximal of the substrate surface from a purge gas flowing through the system, wherein the purge gas is substantially nonreactive (inert) with the first precursor gas. In other embodiments, the radical species is generated from a second precursor gas that may be reactive with the first precursor gas.

While oxygen radicals are a highly reactive species for oxidation of certain metal precursors, such as trimethylaluminum (TMA) and titanium tetrachloride ($TiCl_4$) for example, the present inventors have discovered that thin films deposited in an REALD process involving oxygen plasma generated from regular oxygen gas ($O_2$) are inferior to thin films deposited by many other ALD methods. The inventors' experiments with ozone ($O_3$) precursors have resulted in even poorer films, which suggests that direct oxygen plasmas formed from $O_2$ are an inferior precursor for REALD because they contain a relatively high concentration of ozone—a gas that is much more persistent than oxygen radicals (free radicals) and therefore more likely to migrate into the second precursor zone and react with the metal precursor or other precursor introduced there, causing non-ALD deposition to occur.

The inventors have recognized these phenomena as an opportunity for improved REALD methods and improved methods of generating oxygen radicals for thin film deposition.

DETAILED DESCRIPTION OF PREFERRED EMBODIMENTS

Figure 1:
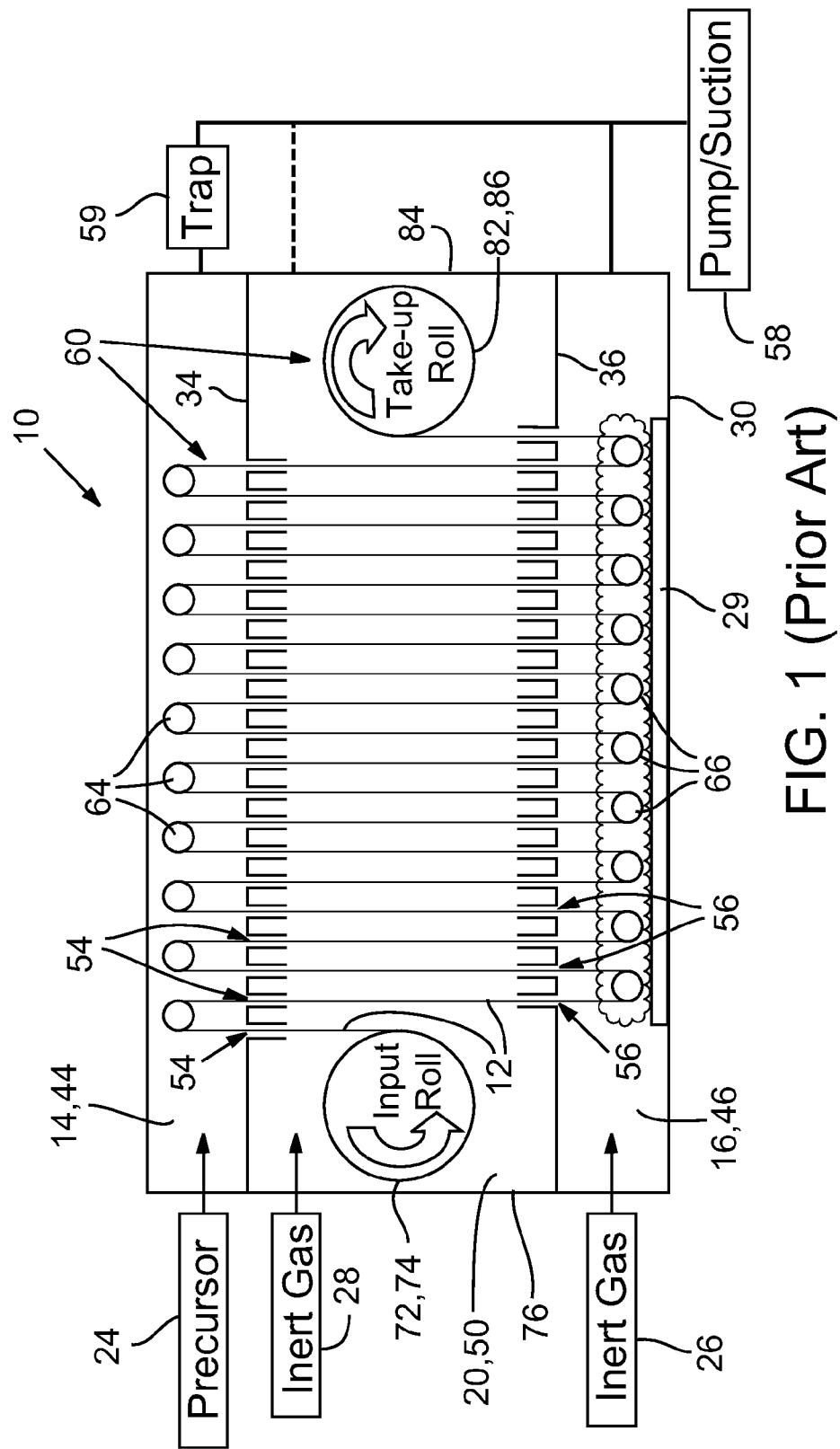
FIG. 1 is a schematic elevation view of a system for web coating according to the prior art.

FIG. 1 shows a cross section elevation of a prior system 10 for REALD of the kind described in the '050 application, for deposition of a thin-film coating onto a flexible substrate 12 (shown in profile in FIG. 1), such as a web of plastic film or metal foil, for example. FIG. 1 illustrates a radical enhanced version of the ALD system for coating flexible substrates described in U.S. patent application Ser. No. 11/691,421, filed Mar. 26, 2007 and published as Pub. No. US 2007/0224348 A1, which is incorporated herein by reference. With reference to FIG. 1, system 10 includes a precursor zone 14 and a radicals zone 16, separated by an intermediate isolation zone 20. A precursor gas is introduced into precursor zone 14 from a precursor delivery system 24. A second precursor gas or a purge gas is introduced into radicals zone 16 from a second precursor delivery system 26. An inert gas delivery system 28 is included for injecting inert gas into isolation zone 20. Radicals are formed in radicals zone 16 by a radicals generator 29, which is preferably positioned proximal of the substrate to generate a direct plasma from the second precursor gas (or purge gas) in radicals zone 16.

Precursor zone 14, radicals zone 16, and isolation zone 20 are bordered by an outer reaction chamber housing or vessel 30, divided by first and second dividers 34, 36 into three sub-chambers, namely, a first precursor chamber 44, a second precursor chamber 46 and an inert gas chamber 50. A series of first passageways 54 through first divider 34 are spaced apart along a general direction of travel of substrate 12, and a corresponding series of second passageways 56 are provided through second divider 36. The passageways 54, 56 are arranged and configured for substrate 12 to be threaded therethrough back and forth between precursor and radicals zones 14, 16 multiple times, and each time through isolation zone 20. Isolation zone 20 is, thus, preferably separated (albeit imperfectly) from precursor zone 14 by first divider 34 and from radicals zone 16 by second divider 36.

Passageways 54, 56 are configured to restrict the flow of gases between the zones 14, 16, 20, to avoid or limit diffusion of precursor gases and radicals into a common zone. Passageways 54, 56 may include slits sized only slightly thicker and wider than the thickness and width of substrate 12 passing through them, leaving only a very small amount of headroom and margins to allow substrate 12 to pass therethrough without scraping against the sides of the passageways. For example, headroom and margins may range between microns and millimeters in certain embodiments. Passageways 54, 56 may also include elongate tunnels (slit valves) through which substrate 12 passes.

To help isolate the precursor gas from the radical species, pressure differentials are preferably established between isolation zone 20 and precursor zone 14 and between isolation zone 20 and radicals zone 16. In one embodiment, the pressure differentials may be generated by injecting inert gas into isolation zone 20 at a pressure greater than the operating pressure of the precursor and radicals zones 14, 16, and then passively exhausting gases from the zones 14, 16. Pressure differentials may also be generated by pumping from precursor zones via a pump 58 or another source of suction. Exhaust precursors may be reclaimed using a precursor trap 59, such as a simple inline liquid nitrogen cooled trap.

A substrate transport mechanism 60 of system 10 includes a carriage comprising multiple turning guides for guiding flexible substrate 12, including a set of first turning guides 64 spaced apart along precursor zone 14 and a second set of turning guides 66 spaced apart along radicals zone 16. Turning guides 64, 66 cooperate to define an undulating transport path of substrate 12 as it advances through system 10. Substrate transport mechanism 60 may include a payout spool 72 for paying out substrate 12 from a first coil (input roll 74) for receipt at a first end 76 of isolation zone 20, vessel 30, precursor zone 14, or radicals zone 16. The substrate transport mechanism 60 may further include a take-up spool 82 for receiving the coated substrate 12 from a second end 84 of isolation zone 20, vessel 30, precursor zone 14, or radicals zone 16 opposite first end 76, and coiling the substrate 12 into a second coil (take-up roll 86).

Oxygen Sources for Radical Generation

When using oxygen radicals as the oxygen source for ALD processing of metal oxide films, there are some particular chemistries and system configurations that may be preferable to others—particularly configurations different from those that are optimized for the use of water as the oxygen precursor in thermal (non-radical) ALD.

In one embodiment of an REALD method according to the present disclosure, monatomic oxygen radicals (O.) are generated from an oxygen-containing second precursor gas and that is not normally reactive with the first precursor (usually a metal-containing precursor), wherein the second precursor gas includes a gaseous oxygen-containing compound and does not contain significant amounts of normal oxygen ($O_2$). These improved REALD methods can allow improved configurations and operation of flexible substrate coating systems, which are described below with reference to FIG. 2. Thin films deposited by these methods and systems may be useful as optical coatings, barrier layers for food packaging or electronics, and many other uses.

With respect to precursor source gases used for generating oxygen radicals, there are many possibilities, particularly with respect to precursors that are gases at room temperature. For example $O_2$ (normal oxygen), $CO_2$, CO, NO, $N_2O$, $NO_2$, air, etc. may all be used for REALD processes in which the primary reaction is oxygen based. Example oxygen-based REALD reactions include formation of aluminum oxide ($Al_2O_3$) thin films at low temperatures (substrate and precursors heated to less than 150° C. and preferably less than 80° C.) using TMA and O. oxygen radicals), and formation of titania ($TiO_2$) thin films at low temperature from $TiCl_4$ and O.. These REALD reactions can be performed in various systems described in the '050 application, and particularly the systems shown in FIGS. 1-3 and 6 thereof.

For attaining the highest concentration of oxygen in REALD, $O_2$ would be a logical choice. However, the present inventors have discovered that alternative oxygen-containing precursor gases, such as $CO_2$ and $N_2O$ may be preferable for several reasons. First, $CO_2$, $N_2O$, and many other gaseous compounds are not flammable and not highly reactive, and therefore may be safer for some methods, systems, applications and installations. Oxygen gas is highly reactive and must be handled with care. More importantly, in comparison with $O_2$, plasmas generated from many oxygen-containing precursor compounds like $CO_2$ and $N_2O$ are less prone to the formation of ozone ($O_3$) in or near the plasma. An oxygen plasma generated from $O_2$ typically forms $O_3$ as a byproduct by the recombination of O. with $O_2$. And while plasmas generated from gaseous oxygen-containing compounds such as $CO_2$ also include O., they are much less likely to form $O_3$ because there is far less $O_2$ present to facilitate such a reaction.

While $O_3$ may be somewhat active in ALD film growth with certain precursors, it may form an inferior oxide film compared to that formed with O.. Such is the case with TMA+$O_3$, compared to TMA+O., for example. $Al_2O_3$ films 200 Å thick made at low temperature with $O_3$ as the co-reactant with TMA had almost no barrier properties—i.e., they exhibited a very high water vapor transmission rate (WVTR). However, $Al_2O_3$ films made at room temperature with TMA and O. (direct plasma) exhibit barrier properties at least as good as films made by thermal ALD with water as the co-reactant, but the growth rate with TMA+O. is more than double per ALD cycle.

Further, when a plasma forms both O. and substantial amounts of $O_3$, the film resulting from the combination of reactions (e.g., TMA+$O_3$ and TMA+O.) may be inferior to a film formed mostly or entirely from reactions with O. in the substantial absence of $O_3$.

Moreover, $O_3$ has a relatively long lifetime compared with O., which is highly unstable. As such, it is more difficult to isolate $O_3$ from the second (metal) precursor zone. On the other hand, O. recombines extremely efficiently and quickly. As such, migration of O. into the metal-containing precursor zone can be prevented simply by adequate spatial separation or by interposing flow restricting devices between the radical zone and the metal-containing precursor zone.

In some embodiments, a substantially pure oxide may be formed through the use of a second precursor gas consisting essentially of a gaseous oxygen-containing compound such as $CO_2$ or $N_2O$, because the non-oxygen constituents of the second precursor gas (e.g., carbon, nitrogen) do not react with the metal-containing first precursor, or at least not with the chemisorbed species of the first precursor. In certain other embodiments, the reaction of the non-oxygen constituents of the second precursor with the metal-containing first precursor (or the chemisorbed species thereof) may be very minor compared to the reaction of the metal-containing precursor (or its chemisorbed species) with the oxygen radicals, so that a mostly pure oxide is formed.

Consequently, in one embodiment, a method of forming a thin film involves alternately exposing a substrate to: (1) a first precursor that chemisorbs to the substrate surface, leaving a chemisorbed species at the surface that is reactive with oxygen and oxygen radicals, and (2) an oxygen radical species, such as monatomic oxygen radicals (O.), that is generated in a plasma formed from a second precursor including a gaseous oxygen-containing compound (or mixture) and not including substantial amounts of $O_2$. For example, a suitable gaseous compound or mixture devoid of a significant amount of $O_2$ may include less than 3% (mole fraction) $O_2$. In some embodiments, a suitable gaseous compound or mixture may include less than 2%, less than 1%, less than 0.1%, or less than 0.01% mole fraction $O_2$. In some embodiments, a suitable compound or mixture is said to be substantially devoid of $O_2$ when it contains less than 0.001% mole fraction $O_2$. In some embodiments, a suitable gaseous compound or mixture contains less than 10 ppm, or less than 1 ppm of $O_2$.

Example precursors reactive with oxygen radicals include diethylzinc (DEZ), which is reactive with oxygen radicals to form ZnO, and Tris[dimethylamino]silane (aka TDMAS), which is reactive with oxygen radicals to form $SiO_2$. In an ALD reaction involving TDMAS precursor and oxygen radicals, a good quality film can be deposited at temperatures below which even water does not work as the oxidizer in a normal thermal ALD process—for example at temperatures below 130° C. Another example precursor that may be used with a REALD process of the kind disclosed herein is tin tetrachloride (SnCl4), which reacts with oxygen radicals to form tin dioxide ($SnO_2$).

In other embodiments, a method of forming a thin oxide film by REALD involves oxygen radicals formed from $O_2$ and a precursor that is not reactive with $O_3$. Examples of precursors not reactive with $O_3$, at least at processing temperatures under 100° C., include titanium tetrachloride ($TiCl_4$), hexachlorosilane ($Si_2Cl_6$), and tetrachlorosilane ($SiCl_4$).

In summary, the processes described above provide a substantial improvement in oxidation capability over other methods and chemistries. Improved reactivity of oxygen radicals without the presence of ozone enables the use of a wider range of metal-containing precursors and other precursors, including ones with acceptable volatility and chemisorption (or adsorption) qualities but poor reactivity with non-radical oxygen and oxygen-containing compounds.

Figure 2:
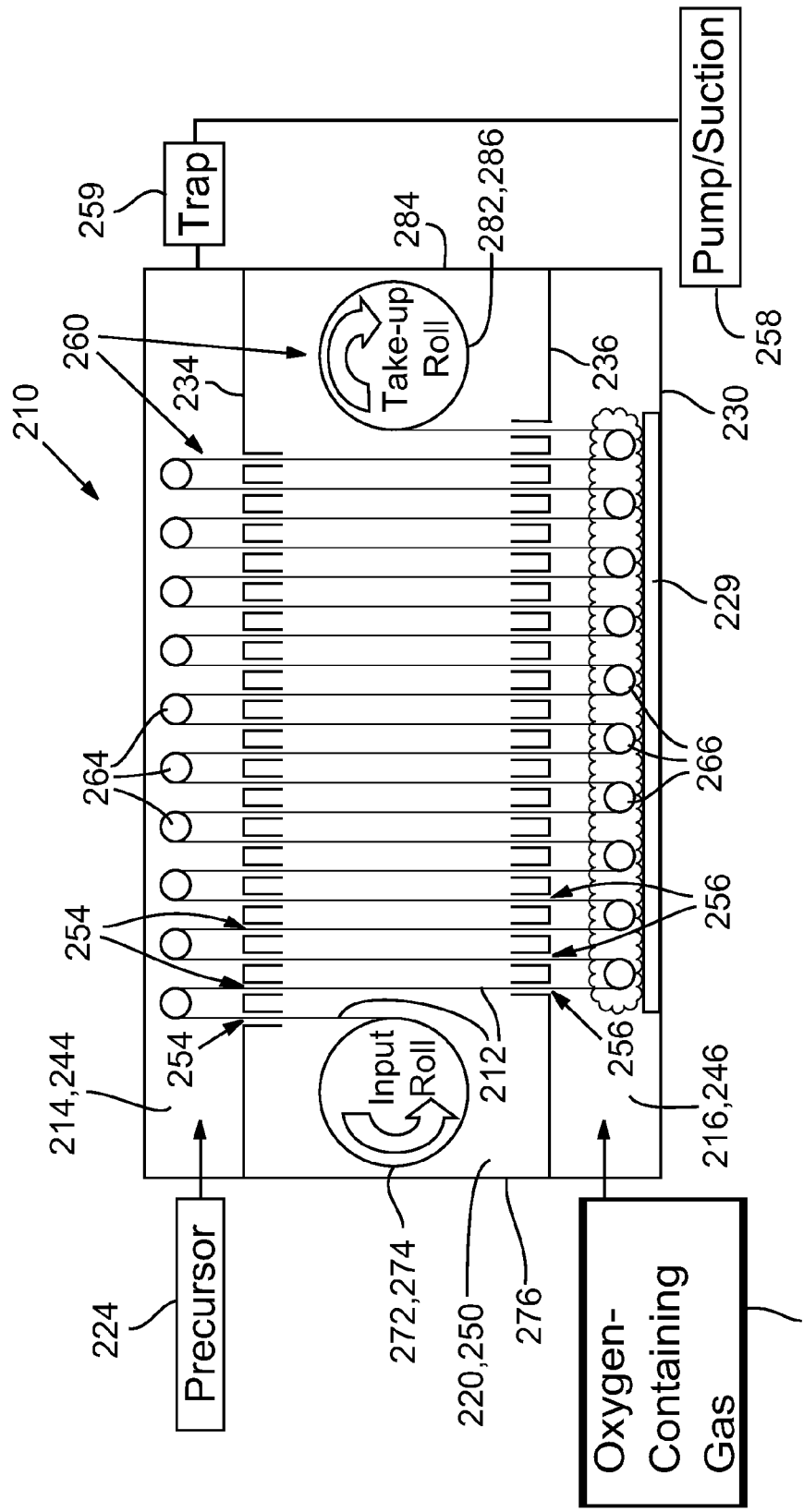
FIG. 2 is a schematic elevation view of a system for REALD web coating according to an embodiment.

The foregoing discoveries enable new configurations of systems and methods for ALD coating of flexible substrates, such as the flexible substrate deposition system 210 illustrated in FIG. 2, which is a variation on the system 10 illustrated in FIG. 1. With reference to FIG. 2, a first precursor 224, such as TMA, is introduced into a first precursor zone 214. A second precursor consisting essentially of an oxygen-containing precursor gas 226 that is not reactive with first precursor 224 is injected into an oxidation zone 216 (second precursor zone). A plasma or other radical-generating mechanism 229 is operably associated with oxidation zone 216 of chamber 230, wherein the radicals generator 229 generates atomic oxygen from the oxygen-containing precursor gas 226. Radicals generator 229 may include a radio-frequency (RF) plasma generator, microwave plasma generator, direct-current (DC) plasma generator, or UV light source, and preferably continuously generates a population of oxygen radical species (illustrated by a cloud in FIG. 2) in-situ within oxidation zone 216 by means of a plasma, for example. Radicals generator 229 may be operated in a continuous or steady-state mode without incurring the penalties of plasma ramp times and build-up of undesirable films or deposits on radicals generator 229 and walls of chamber 230. Oxygen-containing precursor gas 226 may consist of any of the aforementioned gaseous oxygen-containing compounds or mixtures thereof.

Oxidation zone 216 is not pumped—i.e. an exhaust line is not directly connected to the oxidation chamber 246. When system 210 is in use, oxygen-containing precursor gas 226 flows out of oxidation zone 216 through slits 256 into a central buffer zone 220, and then through slits 254 into first precursor zone 214, each time experiencing a pressure drop due to throttling at slits 254, 256 (aka slit valves or passageways) in the partitions 234, 236 between the zones 214, 220, 216. Finally a mixture of the first precursor 224 and the oxygen-containing precursor gas 226 is exhausted from first precursor zone 214 via an exhaust port and drawn away by pump 258, optionally through a precursor recovery trap 259.

By the time the oxygen-containing precursor gas 226 migrates from oxidation zone 216 into first precursor zone 214, all or substantially all of the atomic oxygen (O.) generated in the plasma at oxidation zone 216 has re-combined with other species in the plasma, thus becoming inactive with respect to the first precursor 224. The oxygen-containing precursor gas 226 thus serves both as a precursor source for reactive oxygen radicals (O.), when excited by the plasma, and as a purge gas or isolation gas. Pressure differentials between the zones 214 and 220, and 220 and 216 (both differentials in the same direction) provide twice the resistance to migration of first precursor 224 into oxidation zone 216 as compared to the embodiment shown in FIG. 1, in which the purge gas is introduced into isolation zone 20 at a pressure slightly higher than the two precursor zones 14, 16, which are both pumped.

In one embodiment, radicals generator 229 includes an RF plasma generator or microwave plasma generator that generates a plasma within oxidation zone 216 by exciting the oxygen-containing precursor gas 226 with RF or microwave energy. Passageways 256 may be sufficiently narrow so as to confine the plasma within oxidation zone 216.

A substrate carriage or other substrate transport mechanism 260 moves the substrate quickly through the plasma such that the REALD processes described herein can be performed while an internal temperature of the substrate is maintained below 150° C. throughout the deposition process, and in some embodiments below 80° C. throughout the deposition process.

If the oxygen-containing precursor gas 226 is $O_2$, or contains a significant amount of $O_2$, some amount of ozone would likely enter first precursor zone 214. In this case, it would be desirable to use a precursor that reacts with atomic oxygen (O.), or at least that leaves chemisorbed species at the substrate surface that are reactive with atomic oxygen, but that is not reactive with $O_3$. If, alternatively, a gaseous oxygen-containing compound is used (such as $CO_2$), the levels of $O_3$ entering the chamber will be small to negligible. In that case, a first precursor that does react with $O_3$ could be used, without the detrimental effects of non-ALD film growth in the first precursor zone of the chamber.

The reaction chamber configuration 230 shown in FIG. 2 eliminates or reduces the need to pump from oxidation zone 216, and facilitates the introduction of a large amount of compound oxygen-containing precursor gas 226 directly into oxidation zone 216, where a plasma or other radical-generating means 229 is provided. The oxygen-containing precursor gas 226 then also provides some or all of the purge-based isolation, given that the key radicals of oxygen recombine or become de-activated prior to entering first precursor zone 214.

The improved methods described above may be utilized with virtually any of the reactor configurations and process methodologies described in the '050 application. For example, the use of compound oxygen-containing gases discussed herein may facilitate operation of the system shown in FIG. 4 of the '050 application for oxidation reactions. In an embodiment, a gaseous compound containing oxygen, such as $CO_2$, is utilized as the purge gas from which oxygen radicals are generated. A precursor reactive with oxygen radicals (but not with $CO_2$) is injected at a location in the reciprocating path of the substrate of FIG. 4 generally downstream of the radical generator. The radical generator is spaced apart from the precursor injection site a distance sufficient to provide a radical deactivation zone therebetween, as further described in the '050 application.

Figure 3:
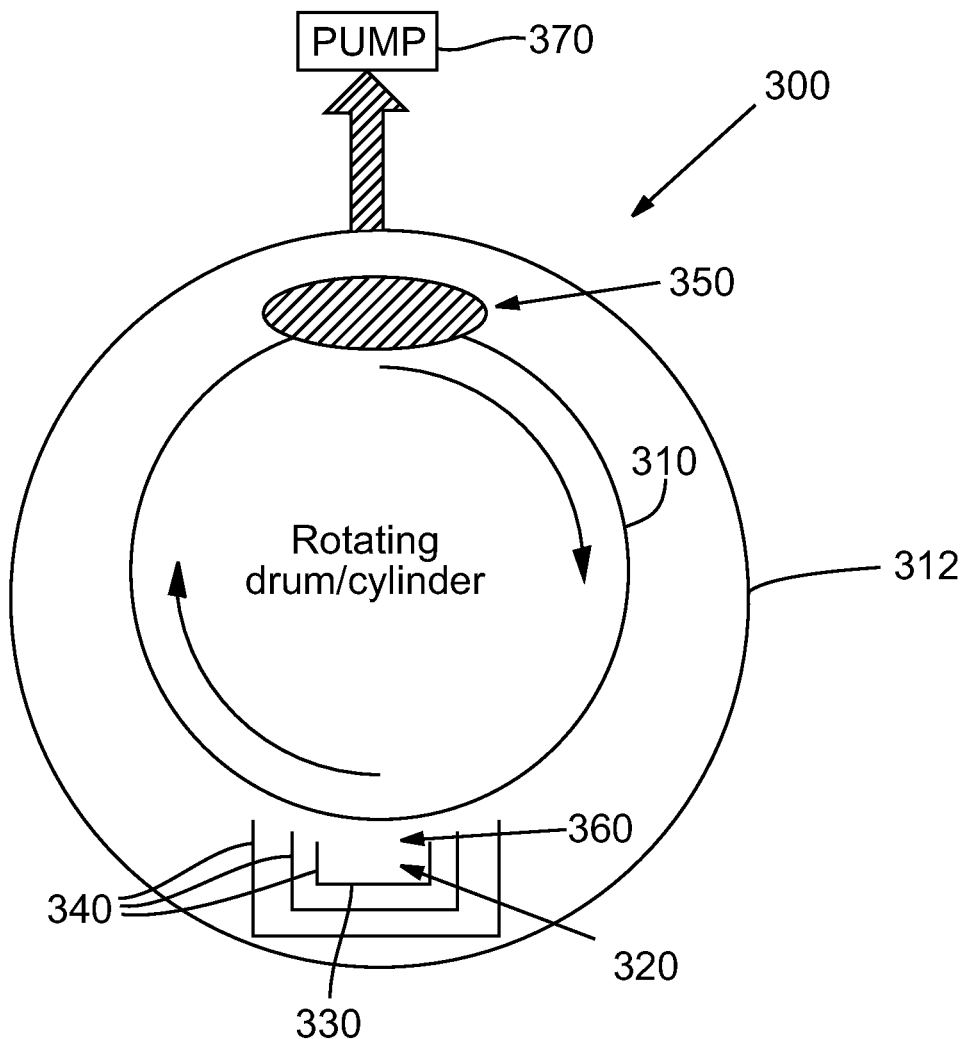
FIG. 3 is a schematic top section view of a drum coating system for REALD according to another embodiment.

A further variant on the embodiment of FIG. 4 of the '050 application used with a gaseous oxygen-containing compound as the purge gas is illustrated in FIG. 3 of the present application, which is a top cross-section view of a drum reactor system 300. With reference to FIG. 3, one or more substrates (not shown) are mounted on a cylindrical drum 310 that spins about its axis within a reaction chamber 312. Purge gas 320 that includes a gaseous oxygen-containing compound and that is devoid of substantial amounts of normal oxygen ($O_2$) is injected at or upstream of a radical generator 330. As illustrated, the radical generator 330 may include a series of baffles 340 to assist with deactivation and recombination of radicals and to prevent radicals from migrating to the site where a precursor is introduced (in this example the injection site 350 for TMA). However, in other embodiments, simpler baffles may suffice or no baffles may be needed. Precursor, such as TMA chemisorbs to the surface of the substrate at the precursor injection site 350 in the form of a chemisorbed species before the substrate is transported by rotation of drum 310 to radical activation zone 360. Oxygen radicals are generated from the purge gas 320 at radical activation zone 360 where they react with the chemisorbed precursor species at the substrate surface to complete the ALD cycle and form a monolayer. The oxygen radicals are preferably generated with a plasma, although other sources for excitation may be utilized, as noted in the '050 application. Because the oxygen radicals recombine so quickly and easily, no substantial amount of the oxygen radical species is carried into precursor injection site 350. Moreover, because the direction of purge gas flow is from radical zone 360 to an exhaust pump 370 on the opposite side of drum 310 and reaction chamber 312, downstream of precursor injection site 350, little or no precursor migrates to radical generation site 360. Consequently, the system 300 of FIG. 3 enables ALD-type deposition of oxide thin films without complicated flow control, baffling or substrate transport mechanisms.

EXAMPLE 1

$TiO_2$ Thin Film from $TiCl_4$ and Oxygen Radicals

Substrate: 2.2 meter band (loop) of PET wrapped around roller guides to circulate through the precursor zone and oxidation zone repeatedly, in a 3-zone reactor system of the kind shown in FIG. 2 but with only two passageways 254 and two passageways 256.
Oxidation temperature: 70° C.
Working pressure: 1.2 Torr, nominal
Radicals generator: DC plasma, power of approximately 200 W, with electrode placed within 1 cm of the substrate.
Oxygen-containing gas: clean dry compressed air injected into oxidation zone. (Note: $TiCl_4$ does not readily react with ozone to form $TiO_2$ on a polymer surface at 70° C.)
Growth rate: approximately 1 Å/cycle.

EXAMPLE 2

$Al_2O_3$ Thin Film from TMA and Oxygen Radicals

Substrate: 2.2 meter band (loop) of PET wrapped around roller guides to circulate through the precursor zone and oxidation zone repeatedly, in a 3-zone reactor system of the kind shown in FIG. 2 but with only two passageways 254 and two passageways 256.
Substrate temperature: 90° C.
Working pressure: 1.2 Torr, nominal
Radicals generator: DC plasma, power of approximately 200 W, with electrode placed within 1 cm of the substrate.
Oxygen-containing gas: $CO_2$. (Note: TMA is slightly reactive with high concentrations of $O_2$, and is reasonably reactive with $O_3$.)
Growth rate: approximately 1.6 Å/cycle.

EXAMPLE 3

ZnO Thin Film from DEZ and Oxygen Radicals

Substrate: 2.2 meter band (loop) of PET wrapped around roller guides to circulate through the precursor zone and oxidation zone repeatedly, in a 3-zone reactor system of the kind shown in FIG. 2 but with only two passageways 254 and two passageways 256.
Substrate temperature: 90° C.
Working pressure: 1.2 Torr, nominal
Radicals generator: DC plasma, power of approximately 200 W, with electrode placed within 1 cm of the substrate.
Oxygen-containing gas: high purity $CO_2$. (Note: DEZ is highly reactive with $O_2$ and $O_3$.)
Expected growth rate: 1.2 Å/cycle.

It will be obvious to those having skill in the art that many changes may be made to the details of the above-described embodiments without departing from the underlying principles of the invention. The scope of the present invention should, therefore, be determined only by the following claims.

The invention claimed is:
1. A method of depositing a thin barrier film, comprising:
introducing a first precursor gas into a precursor chamber, the first precursor gas being reactive with ozone;
injecting a flow of a second precursor gas into an oxidation zone that is distinct from the precursor chamber and separated therefrom by a partition through which one or more flow-restricting passageways extend, the second precursor gas including an oxygen-containing compound that at room temperature is a gas, that is substantially nonreactive with the first precursor gas and that is devoid of a significant amount of normal oxygen gas ($O_2$);
exhausting from the precursor chamber so that at least some of the second precursor gas flows from the oxidation zone through the passageways and into the precursor chamber, thereby inhibiting the first precursor gas from migrating into the oxidation zone;
transporting a substrate along a transport path back and forth between the precursor chamber and the oxidation zone multiple times, the transport path extending through at least some of the passageways and into the precursor chamber where the first precursor gas chemisorbs to a surface of the substrate as a chemisorbed species; and
generating an unstable oxygen radical species from the oxygen-containing compound without generating ozone by forming a plasma from the second precursor gas in the oxidation zone proximal of the transport path so that the substrate is exposed to the unstable oxygen radical species without being exposed to ozone when the substrate is transported through the oxidation zone, the unstable oxygen radical species being reactive with the chemisorbed species to deposit a thin barrier film on the substrate.

2. The method of claim 1, wherein the second precursor gas includes less than 0.1% mole fraction of normal oxygen ($O_2$).

3. The method of claim 1, wherein the second precursor gas consists essentially of carbon dioxide ($CO_2$).

4. The method of claim 1, wherein the second precursor gas consists essentially of nitrous oxide ($N_2O$).

5. The method of claim 1, wherein the second precursor gas consists essentially of a mixture of two or more of $CO_2$, CO, NO, $N_2O$, and $NO_2$.

6. The method of claim 1, wherein the unstable oxygen radical species consists primarily of monatomic oxygen radicals (O.).

7. The method of claim 1, wherein the first precursor gas is selected from the group consisting of trimethylaluminum (TMA), titanium tetrachloride ($TiCl_4$), hexachlorosilane ($Si_2Cl_6$), tetrachlorosilane ($SiCl_4$), diethylzinc (DEZ), tris[dimethylamino]silane (TDMAS), and tin tetrachloride ($SnCl_4$).

8. The method of claim 1, wherein the surface of the substrate is exposed to the plasma as the substrate is transported through the oxidation zone.

9. The method of claim 1, further comprising heating the substrate to an internal temperature of less than 150 degrees Celsius.

10. The method of claim 1, further comprising heating the substrate to an internal temperature of less than 80 degrees Celsius.

11. The method of claim 1, wherein the substrate is flexible and the step of transporting the substrate along a transport path back and forth between the precursor chamber and the oxidation zone includes winding the substrate around a series of turning guides that guide the substrate along an undulating transport path.

12. The method of claim 1, wherein:
the step of generating the plasma includes exciting the compound oxygen-containing gas within the oxidation zone by application of radio-frequency or microwave energy; and
the passageways are sufficiently narrow so as to confine the plasma within the oxidation zone.

13. The method of claim 1, further comprising separating the oxidation zone from the precursor chamber by a buffer zone, the oxidation zone separated from the buffer zone by a second partition through which a second set of one or more flow-restricting passageways extends.

14. The method of claim 1, wherein the step of exhausting from the precursor chamber includes pumping from the precursor chamber.

15. A process for depositing a thin barrier oxide film on a surface, comprising:
generating an unstable oxygen radical species from an oxygen-containing compound without generating ozone, wherein the oxygen-containing compound when at room temperature, is a gas that is devoid of a significant amount of normal oxygen gas ($O_2$); and
repeatedly alternately exposing the surface to the unstable oxygen radical species and to a precursor gas that chemisorbs to the surface as a chemisorbed species, while preventing the oxygen radical species from mixing with the precursor gas, the unstable oxygen radical species reactive with the chemisorbed species at the surface to thereby form a thin oxide film on the surface.

16. The process of claim 15, wherein the oxygen-containing compound includes less than 1% mole fraction of normal oxygen ($O_2$).

17. The process of claim 15, wherein the oxygen-containing compound includes less than 0.01% mole fraction of normal oxygen ($O_2$).

18. The process of claim 15, wherein the oxygen-containing compound consists essentially of carbon dioxide ($CO_2$).

19. The process of claim 15, wherein the oxygen-containing compound consists essentially of nitrous oxide ($N_2O$).

20. The process of claim 15, wherein the oxygen-containing compound consists essentially of a mixture of two or more of $CO_2$, CO, NO, $N_2O$, and $NO_2$.

21. The process of claim 15, wherein the precursor gas is selected from the group consisting of trimethylaluminum (TMA), titanium tetrachloride ($TiCl_4$), hexachlorosilane ($Si_2Cl_6$), tetrachlorosilane ($SiCl_4$), diethylzinc (DEZ), tris[dimethylamino]silane (TDMAS), and tin tetrachloride ($SnCl_4$).

22. The process of claim 21, wherein the unstable oxygen radical species consists primarily of monatomic oxygen radicals (O.) generated by forming a plasma from the gaseous oxygen-containing compound.

23. The process of claim 15, wherein the step of exposing the substrate to an unstable oxygen radical species includes exposing the substrate to a plasma formed from the gaseous oxygen-containing compound.

24. The process of claim 15, wherein:
the precursor gas comprises trimethylaluminum (TMA) or titanium tetrachloride ($TiCl_4$) or tris[dimethylamino]silane (TDMAS); and
an internal temperature of the substrate is maintained below 150 degrees Celsius throughout the deposition process.

25. The process of claim 15, wherein an internal temperature of the substrate is maintained below 80 degrees Celsius throughout the deposition process.

* * * * *

UNITED STATES PATENT AND TRADEMARK OFFICE
CERTIFICATE OF CORRECTION

PATENT NO. : 8,637,123 B2  
APPLICATION NO. : 12/980234  
DATED : January 28, 2014  
INVENTOR(S) : Eric R. Dickey and William A. Barrow Page 1 of 2

It is certified that error appears in the above-identified patent and that said Letters Patent is hereby corrected as shown below:

Title Page, Item (57) Abstract, line 4, replace "(O.)" with --(O•)--.

In the Specification

In column 3, line 26, replace "(O.)" with --(O•)--.

In column 3, line 27, delete "and".

In column 3, line 48, replace "oxygen" with --(oxygen--.

In column 3, line 48, replace "(O.)" with --(O•)--.

In column 3, line 49, replace "(O.)" with --(O•)--.

In column 3, line 56, replace "$N_2O$" with --$N_2O$,--.

In column 3, line 66, replace "(O.)" with --(O•)--.

In column 4, line 1, replace "(O.)" with --(O•)--.

In column 4, line 6, replace "(O.)" with --(O•)--.

In column 4, line 7, replace "(O.)" with --(O•)--.

In column 4, line 11, replace "(O.)" with --(O•)--.

In column 4, line 14, replace "(O.)" with --(O•)--.

In column 4, line 16, replace "(O.)" with --(O•)--.

In column 4, line 18, replace "(O.)" with --(O•)--.

Signed and Sealed this  
Twenty-fifth Day of November, 2014

Michelle K. Lee  
*Deputy Director of the United States Patent and Trademark Office*

CERTIFICATE OF CORRECTION (continued)
U.S. Pat. No. 8,637,123 B2

In column 4, line 19, replace "(O.)" with --(O•)--.

In column 4, line 22, replace "(O.)" with --(O•)--.

In column 4, line 24, replace "(O.)" with --(O•)--.

In column 4, line 25, replace "(O.)" with --(O•)--.

In column 4, line 47, replace "(O.)" with --(O•)--.

In column 5, line 34, replace ";" with --,--.

In column 5, line 59, replace "(O.)" with --(O•)--.

In column 5, line 64, replace "(O.)" with --(O•)--.

In column 6, line 23, replace "(O.)" with --(O•)--.

In column 7, line 5, replace "Precursor, such as TMA" with --A precursor, such as TMA,--.

In column 10, line 26, replace "(O.)" with --(O•)--.